(12) United States Patent
Allen et al.

(10) Patent No.: US 10,522,937 B2
(45) Date of Patent: Dec. 31, 2019

(54) CONVENIENCE INTERFACE DEVICE WITH MAGNETICALLY SEALING COVER

(71) Applicant: Grace Engineered Products, Inc., Davenport, IA (US)

(72) Inventors: Philip Brown Allen, Davenport, IA (US); Drew Philip Allen, Davenport, IA (US)

(73) Assignee: Grace Engineered Products, Inc., Davenport, IA (US)

( * ) Notice: Subject to any disclaimer, the term of this patent is extended or adjusted under 35 U.S.C. 154(b) by 0 days.

(21) Appl. No.: 16/191,276

(22) Filed: Nov. 14, 2018

(65) Prior Publication Data
US 2019/0148871 A1 May 16, 2019

Related U.S. Application Data

(60) Provisional application No. 62/585,926, filed on Nov. 14, 2017.

(51) Int. Cl.
*H01H 13/04* (2006.01)
*H01R 13/447* (2006.01)
(Continued)

(52) U.S. Cl.
CPC ........... *H01R 13/447* (2013.01); *E05C 19/16* (2013.01); *H01F 7/02* (2013.01); *H01R 13/73* (2013.01);
(Continued)

(58) Field of Classification Search
CPC .................................................. H01R 13/447
(Continued)

(56) References Cited

U.S. PATENT DOCUMENTS 3,629,789 A * 12/1971 Szeremy .............. H01R 13/447 439/222
3,641,472 A * 2/1972 Phillips, Jr. ............ H01R 31/00 439/34

(Continued)

OTHER PUBLICATIONS

GracePort® Ethernet Port Connector Code Data Sheet, Grace Engineered Products, Inc. 2006, 1 page.

*Primary Examiner* — Neil Abrams
(74) *Attorney, Agent, or Firm* — Goodhue, Coleman & Owens, P.C.

(57) ABSTRACT

A convenience interface device is provided for personnel to access devices that reside inside an enclosure without opening the enclosure door. The convenience interface device includes a housing, a cover assembly comprising a cover and a cover receiving frame operatively connected to the housing, a first metal insert and a first magnet for magnetically connecting together, one of the first metal insert and the first magnet on one of the cover or the receiving frame and the other of the first metal insert and the first magnet on the other of the cover or the receiving frame, and a second metal insert and a second magnet for magnetically connecting together, one of the second metal insert and the second magnet on one of the cover or the receiving frame and the other of the second metal insert and the second magnet on the other of the cover or the receiving frame. The housing passes through an opening in the enclosure door and includes inside and outside outlet faces. The cover may be held closed by the magnet and metal inserts or alternatively by screws when a more secure closure is needed.

11 Claims, 6 Drawing Sheets

(51) Int. Cl.
  *E05C 19/16* (2006.01)
  *H05K 5/03* (2006.01)
  *H05K 5/02* (2006.01)
  *H01F 7/02* (2006.01)
  *H01R 13/73* (2006.01)

(52) U.S. Cl.
  CPC .............. *H05K 5/0247* (2013.01); *H05K 5/03* (2013.01); *E05Y 2201/218* (2013.01); *E05Y 2201/46* (2013.01); *E05Y 2800/674* (2013.01); *E05Y 2800/71* (2013.01); *E05Y 2900/606* (2013.01)

(58) Field of Classification Search
  USPC ........ 439/142–144, 133; 53/53, 58; 361/616
  See application file for complete search history.

(56) References Cited

U.S. PATENT DOCUMENTS

| | | | | |
|---|---|---|---|---|
| 3,647,165 A * | 3/1972 | Whitla | ................ | A62B 25/005 244/118.5 |
| 3,848,088 A * | 11/1974 | Bentz | ................ | H01R 13/53 358/305 |
| 4,091,246 A * | 5/1978 | Donofrio | ............. | H01R 13/707 200/50.28 |
| 4,584,856 A * | 4/1986 | Petersdorff | ........... | E05B 17/142 379/445 |
| 5,568,362 A * | 10/1996 | Hansson | ............... | H02B 1/305 174/50 |
| 5,625,531 A * | 4/1997 | Padilla | .................... | H02B 1/26 361/623 |
| 6,256,881 B1 * | 7/2001 | Starkey | ............... | B29C 33/0083 29/856 |
| 6,445,585 B1 * | 9/2002 | Walker | ................. | H05K 5/0017 292/145 |
| 6,700,062 B1 | 3/2004 | Allen et al. | | |
| 6,737,582 B2 * | 5/2004 | Van Lieu | ................ | H01R 4/64 174/53 |
| 6,881,898 B2 * | 4/2005 | Baker | ...................... | H02B 1/30 174/50 |
| 6,913,473 B2 * | 7/2005 | Schmid | ...................... | G06F 1/18 361/727 |
| 6,932,624 B1 * | 8/2005 | Hoopes | ............... | H01R 13/6276 174/53 |
| 7,172,101 B2 * | 2/2007 | Find | .................... | A47J 41/0005 220/230 |
| 7,909,205 B2 * | 3/2011 | Moon | ................... | A45D 40/221 132/293 |
| 8,215,684 B2 * | 7/2012 | Whitens | .................... | B60R 7/06 292/251.5 |
| 8,435,041 B2 * | 5/2013 | Holland | ............. | H01R 13/5213 439/38 |
| 8,464,731 B1 * | 6/2013 | Eberlein | .............. | A45D 40/221 132/301 |
| 8,530,757 B2 * | 9/2013 | Dinh | ...................... | H02G 3/088 174/481 |
| 9,214,310 B2 * | 12/2015 | Boyer | ...................... | H01H 85/20 |
| 9,952,641 B1 * | 4/2018 | Wang | ..................... | G06F 1/1616 |
| 10,224,680 B2 * | 3/2019 | Garcia | .................... | H02G 3/18 |
| 2004/0099702 A1 * | 5/2004 | Conner | ............... | A44B 11/005 224/163 |
| 2005/0250360 A1 * | 11/2005 | Cantie | ................... | H01R 13/74 439/100 |
| 2007/0234757 A1 * | 10/2007 | Sherman | ................... | A44C 25/002 63/18 |
| 2019/0148871 A1 * | 5/2019 | Allen | .................... | H01R 13/447 439/38 |

* cited by examiner

CONVENIENCE INTERFACE DEVICE WITH MAGNETICALLY SEALING COVER

PRIORITY STATEMENT

This application claims priority to U.S. Provisional Patent Application No. 62/585,926 filed on Nov. 14, 2017 and is hereby incorporated by reference in its entirety.

FIELD OF THE INVENTION

The present invention relates to convenience interface devices or panel interfaces. More particularly, but not exclusively, the present invention relates to such a device with a magnetically sealing cover.

BACKGROUND

The present invention relates to products that are often known as convenience interfaces or panel interfaces. A convenience interface provides a convenient method for personnel to access devices that reside inside an enclosure without opening the enclosure door. These devices can include: (1) control devices with data ports, (2) network access ports, and (3) human interface ports such as for a computer mouse or keyboard, (4) various I/O devices, (5) data storage devices, and (6) programmable devices. The convenience interface sometimes contains various types of electrical power outlets so that personnel can also power their programming device from the same location as the convenience interface. Various equipment, machines, or facilities have control panels that contain one or more of the types of devices described above. Installing a convenience interface with a power outlet and an interface for all the applicable devices inside the control panel allows personnel to perform maintenance without opening the panel door thereby reducing their exposure to the hazardous voltage inside the enclosure. Various control panels are built with a separate power outlet mounted on the inside of the enclosure to provide power for the personnel working inside the panel, the separate power outlet being independent of the convenience interface. The separate power outlet mounted on the inside of the enclosure may include a Ground Fault Circuit Interrupter (GFCI). Additional information about convenience interfaces is disclosed in U.S. Pat. No. 6,700,062, hereby incorporated by reference in its entirety.

One potential issue with such interface devices is that because they are mounted to a panel exterior they are exposed to environmental conditions which may potentially include water or other contaminants which may have an adverse effect on the interface device and potentially leading to shorts. To address this issue, such devices may have a cover which seals with the main body of the housing. When the device is not being used, the cover is supposed to be securely clamped in place. Issues may be created, however, through human error if individuals working with the device do not follow proper procedures and fail to secure the covers in place. What is needed is an improved convenience interface device.

SUMMARY

Therefore, it is a primary object, feature, or advantage of the present invention to improve over the state of the art.

It is a further object, feature, or advantage of the present invention to provide a housing for convenience interface devices which includes a cover.

It is a still further object, feature, or advantage of the present invention to provide a convenience interface device with a cover that provides for closing in a manner to provide at least some protection against water or other contaminants even when an individual fails to properly follow proper procedures.

One or more of these and/or other objects, features, or advantages of the present invention will become apparent from the specification and claims that follow. No single embodiment need provide each and every object, feature, or advantage. Different embodiments may have different objects, features, or advantages. Therefore, the present invention is not to be limited to or by an objects, features, or advantages stated herein.

According to one aspect, a convenience interface device is provided for personnel to access devices that reside inside an enclosure without opening the enclosure door. The convenience interface device includes a housing, a cover assembly comprising a cover and a cover receiving frame operatively connected to the housing, a first metal insert and a first magnet for magnetically connecting together, one of the first metal insert and the first magnet on one of the cover or the receiving frame and the other of the first metal insert and the first magnet on the other of the cover or the receiving frame, and a second metal insert and a second magnet for magnetically connecting together, one of the second metal insert and the second magnet on one of the cover or the receiving frame and the other of the second metal insert and the second magnet on the other of the cover or the receiving frame. Each of the first metal insert and the second metal insert may be threaded to receive a screw. The first magnet may be positioned around a first aperture for receiving a first screw and the second magnet may be positioned around a second aperture for receiving a second screw. The convenience interface device may have a hinge operatively connected between the cover receiving frame and the housing.

According to another aspect, a convenience interface device for personnel to access devices that reside inside an enclosure without opening the enclosure door is provided. The convenience interface includes a housing, a cover assembly comprising a cover and a cover receiving frame operatively connected to the housing, a first aperture within the cover receiving frame with a first metal insert positioned within the first aperture, a second aperture within the cover receiving frame with a second metal insert positioned within the second aperture, a first aperture within the cover with a first magnet positioned around the first aperture within the cover, and a second aperture within the cover with a second magnet positioned around the second aperture within the cover. Each of the first metal insert and the second metal insert is threaded to receive a screw. The convenience interface device may further include a hinge operatively connected between the cover receiving frame and the housing.

According to another aspect, a convenience interface device for personnel to access devices that reside inside an enclosure without opening the enclosure door is provided. The device includes a housing, a cover assembly comprising a cover and a cover receiving frame operatively connected to the housing, a first aperture within the cover receiving frame with a first magnet positioned around the first aperture, a second aperture within the cover receiving frame with a second magnet positioned around the second aperture, a first aperture within the cover with a first metal insert positioned within the first aperture within the cover, and a second aperture within the cover with a second metal insert positioned within the second aperture within the cover. Each of the first metal insert and the second metal insert may be threaded to receive a screw. The convenience interface device may further include a hinge operatively connected between the cover receiving frame and the housing.

According to another aspect, a convenience interface device for personnel to access devices that reside inside an enclosure without opening the enclosure door to thereby limit exposure of the personnel to electrical equipment within the enclosure is provided. The convenience interface device includes a convenience interface housing and an assembly disposed within the convenience interface housing, the assembly having an inside face and an outside face opposite the inside face, the inside face for being disposed within the enclosure, the outside face for being outside of the enclosure. There is an inside power receptacle on the inside face and which is accessible from inside the enclosure. There is an outside power receptacle on the outside face which is accessible from outside the enclosure. There is a cover assembly including a cover and a cover receiving frame operatively connected to the convenience interface housing for covering the outside face of the assembly when the cover is in a closed position or a securely closed position and allowing access to the outside face of the assembly when the cover is in an open position. There is a first metal insert and a first magnet for magnetically connecting together, one of the first metal insert and the first magnet on one of the cover or the receiving frame and the other of the first metal insert and the first magnet on the other of the cover or the receiving frame and a second metal insert and a second magnet for magnetically connecting together, one of the second metal insert and the second magnet on one of the cover or the receiving frame and the other of the second metal insert and the second magnet on the other of the cover or the receiving frame.

According to another aspect, a convenience interface device for personnel to access devices that reside inside an enclosure without opening the enclosure door is provided. The device includes a convenience interface housing and an assembly disposed within the convenience interface housing, the assembly having an inside face and an outside face opposite the inside face, the inside face for being disposed within the enclosure, the outside face for being outside of the enclosure. There is an inside power receptacle on the inside face and accessible from inside the enclosure and an outside power receptacle on the outside face and accessible from outside the enclosure. There is a cover assembly comprising a cover and a cover receiving frame operatively connected to the convenience interface housing. There is a first aperture within the cover receiving frame with a first metal insert positioned within the first aperture and a second aperture within the cover receiving frame with a second metal insert positioned within the second aperture. There is a first aperture within the cover with a first magnet positioned around the first aperture within the cover and a second aperture within the cover with a second magnet positioned around the second aperture within the cover. Each of the first metal insert and the second metal insert is threaded to receive a screw.

BRIEF DESCRIPTION OF THE DRAWINGS

Illustrated embodiments of the disclosure are described in detail below with reference to the attached drawing figures, which are incorporated by reference herein.

DETAILED DESCRIPTION

Figure 1:
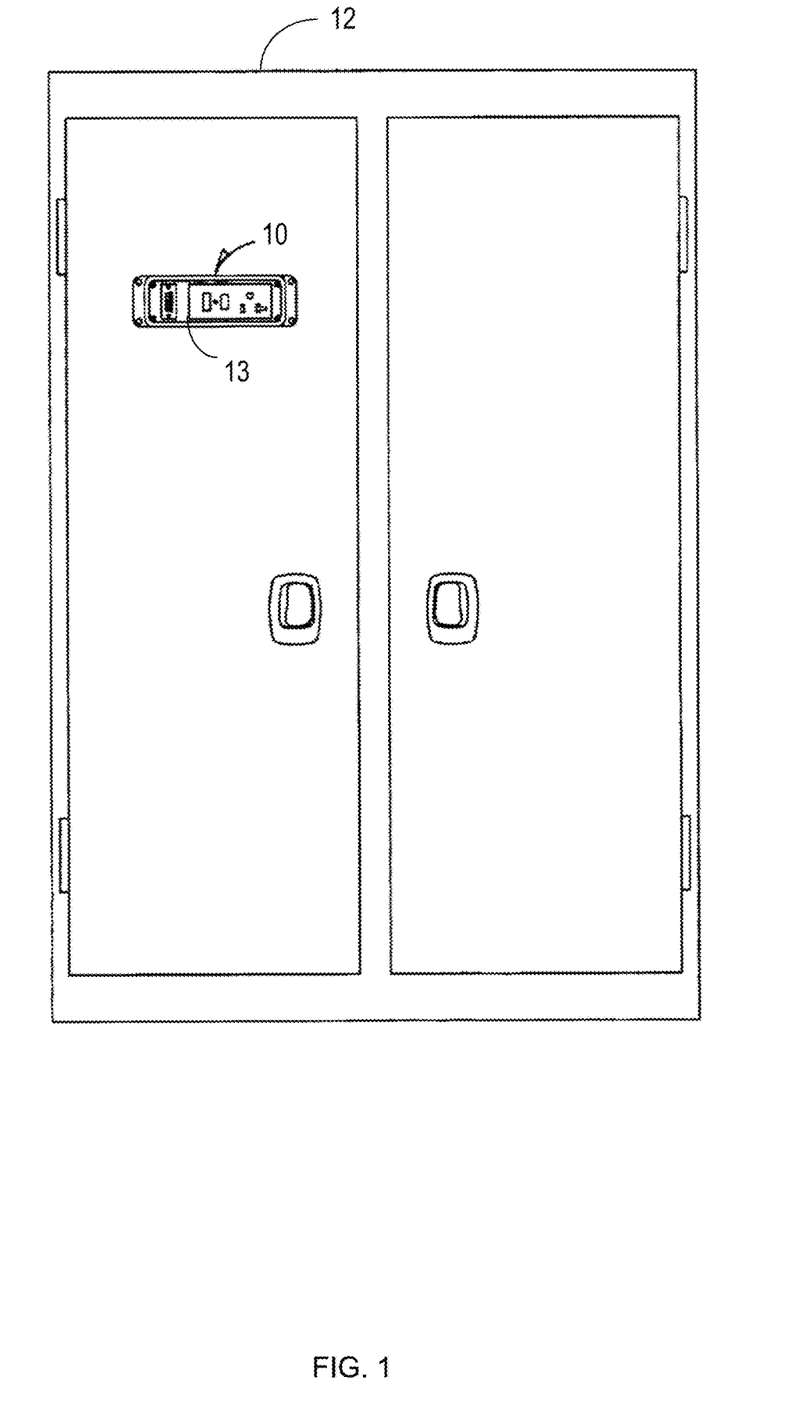
FIG. 1 illustrates a convenience interface mounted to a control panel cabinet with the cover removed.

FIG. 1 illustrates one example of a convenience interface device 10 which may be mounted to a control panel cabinet 12. The convenience interface device 10 includes a housing 13 with an outside face and various outlets or connectors may be mounted to the outside face. There may be an inside face opposite the outside face and one or more connectors may also be present on the inside face. What is shown is merely representative. The present invention contemplates that any number of types of different inside faces and opposite outside faces and any number of different connectors may present such as those present on GracePort® convenience interfaces available from Grace Engineered Products, Inc.

Figure 2:
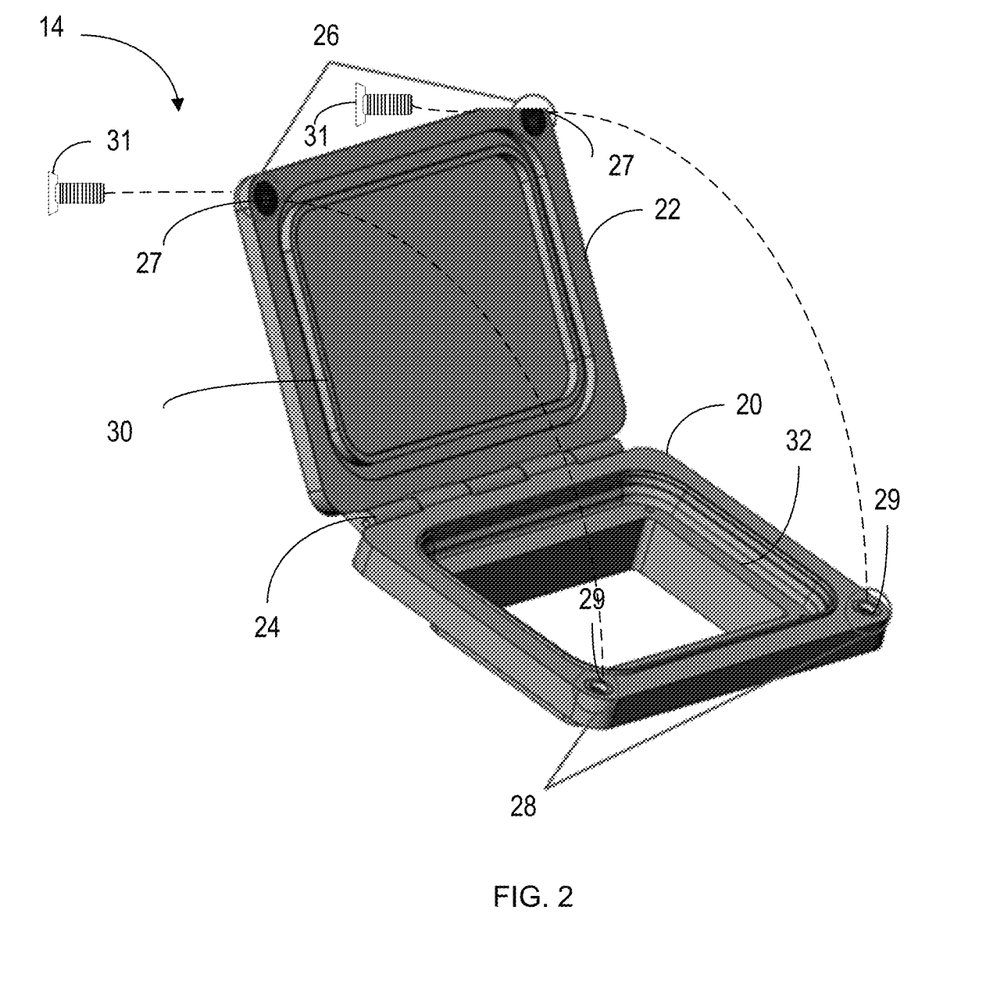
FIG. 2 illustrates a cover assembly for a convenience interface, the cover assembly including a cover and a cover receiving frame.

FIG. 2 illustrates a cover assembly 14 which may be used on a convenience interface device similar to that shown in FIG. 1. It is to be understood that the convenience interface device may be of different sizes and shapes but is often generally rectangular. The cover assembly 14 has a cover receiving frame 20 for receiving a cover 22. A plurality of magnets 26 are positioned around an outer annular portion at holes 27 of the cover to magnetically connect with a plurality of metal inserts 28 positioned around an outer annular portion at holes 29 of the cover receiving frame 20. Although two magnets 26 are shown to magnetically couple with two metal inserts 28, it is to be understood that more or fewer may be present in a particular design. It is to be further understood that each metal insert may magnetically couple to a magnet and each magnet may magnetically couple to a metal insert.

It is also to be understood that the magnets may be positioned around the holes 27 for the screws 31. Screws 31 may be positioned through the cover 22 and into a threaded insert mount 28 below the magnet. Where a metal insert 28 is used it may be the thread insert for the screws 31 from the lid. Thus, the cover may be secured in two different ways. First, in a closed position only the magnets 26 may be used for closing the cover. This type of closure is not ideal and so may only maintain a minimal environment rating, however this closure still offers significantly more protection than the situation where the cover is left unsealed. Second, the cover 22 may be screwed into the cover receiving frame 22 to fully secure the cover in place in a securely closed position. When the cover 22 is screwed into the cover receiving frame 22 a fully secured fit is maintained to protect against the environment including water or other liquids or other contaminants.

When sealed a member 30 of the cover 22 may engage with a portion 32 of the cover receiving frame 20 in order to provide a tighter fit or seal of the cover 22 and the cover receiving frame 20. Sealing gaskets may also be present to assist in forming a tight seal.

As shown in FIG. 2, a hinge 24 is present. Any number of different types of hinges may be present. Instead of using a hinge, additional sets of holes, magnets, and screws may be added in order to secure the cover in place.

The cover may be made of any number of types of materials. In some embodiments, the cover may be made of a see-through material so that an individual may see the type of connectors present on the interface device without removing the cover.

Figure 3:
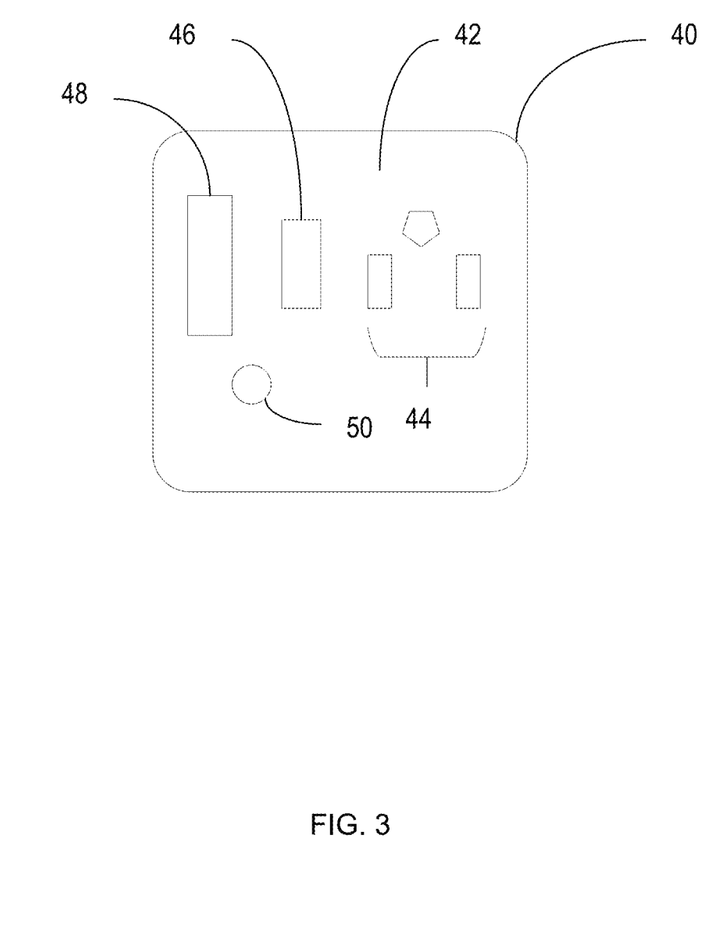
FIG. 3 illustrates an outside face of an assembly of a convenience interface.

FIG. 3 illustrates an assembly 40 removed from the convenience interface housing in which it is generally disposed, the assembly 40 has an inside face and an outside face 42 opposite the inside face, the inside face for being enclosed within the enclosure, the outside face 42 for being outside of the enclosure. The outside face 42 may include an outside power outlet 44 which includes female plug receptacles. The outside power outlet 44 is preferably a standard outlet such as a NEMA 5-15R or NEMA 5-20R. Of course, any number of different types of power outlets may be used such as may be standard in a particular country or otherwise desirable to use. The outside power outlet is accessible from outside of the enclosure. Also shown in FIG. 3 is a test button 46, a reset button 48, and an indicator 50 such as an LED. Other ports or interfaces may be present such as data interfaces including network interfaces, serial interfaces, or other types of interfaces.

Figure 4:
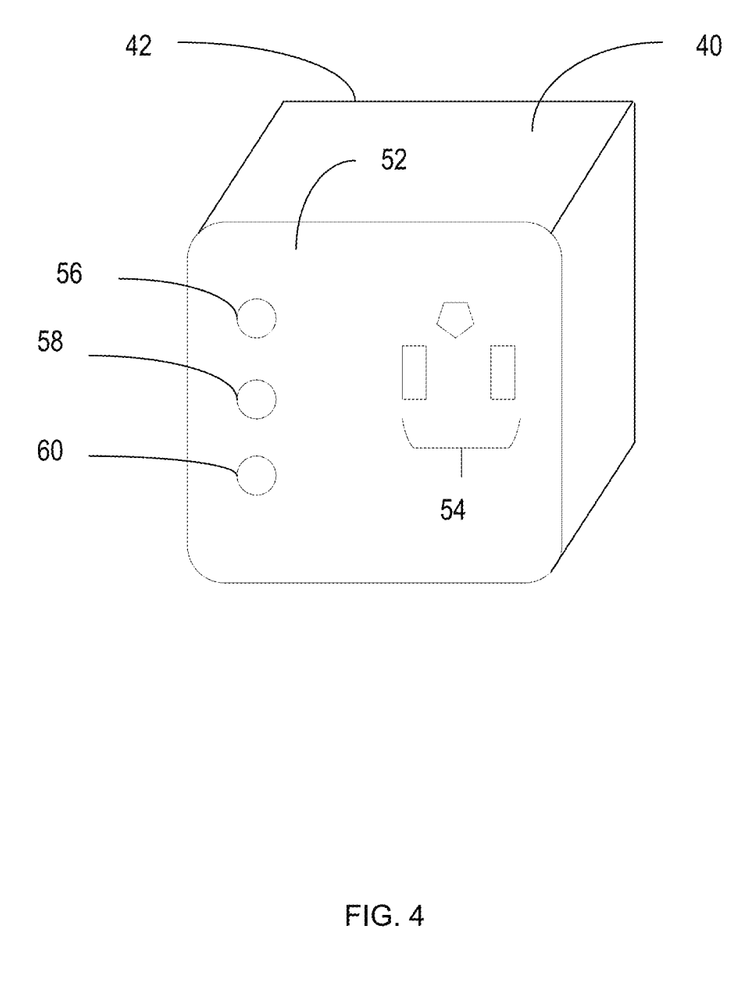
FIG. 4 illustrates an inside face of an assembly of a convenience interface.

FIG. 4 illustrates the assembly 40 with the inside face 52. The inside face 52 has an inside power outlet 54 which includes female plug receptacles. The inside power outlet 54 is preferably a standard outlet such as a NEMA 5-15R or NEMA 5-20R. Of course, any number of different types of power outlets may be used such as may be standard in a particular country or otherwise desirable to use. A plurality of apertures 56, 58, 60 are shown for power line connections. Each power line may be secured with finger safe screws (not shown) inserted into the corresponding one of the apertures.

Figure 5:
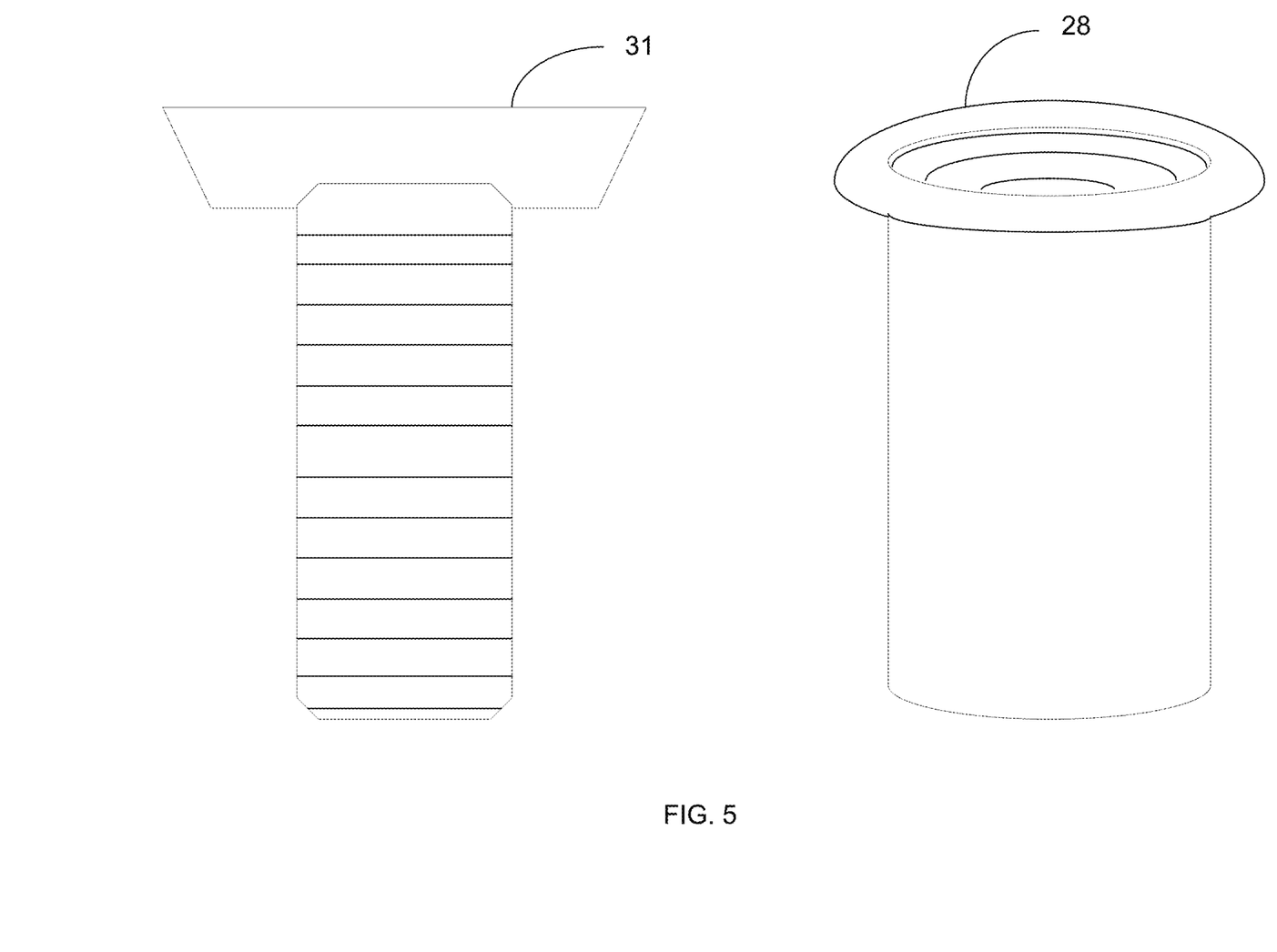
FIG. 5 illustrates a metal insert which is threaded and a screw.

FIG. 5 illustrates a metal insert 28. The metal insert 28 shown is threaded. FIG. 5 further illustrates a screw 31.

Figure 6:
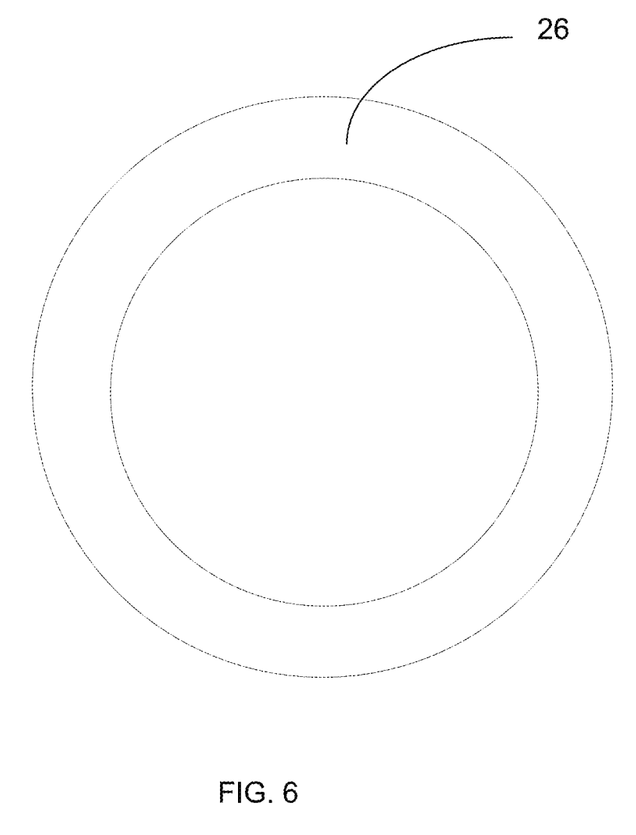
FIG. 6 illustrates a magnet for positioning annularly around a hole.

FIG. 6 illustrates a magnet 26 for positioning annularly around a hole or aperture.

Therefore, a convenience interface has been shown and described. The invention is not to be limited to the particular embodiments described herein. In particular, the invention contemplates numerous variations in the particular shape and style of the housing, the placement of the magnets, the number and type of magnets, and other options, variations, and alternatives. The foregoing description has been presented for purposes of illustration and description. It is not intended to be an exhaustive list or limit any of the invention to the precise forms disclosed. It is contemplated that other alternatives or exemplary aspects are considered included in the invention. The description is merely examples of embodiments, processes or methods of the invention. It is understood that any other modifications, substitutions, and/or additions can be made, which are within the intended spirit and scope of the invention.

What is claimed is:

1. A convenience interface device for personnel to access devices that reside inside an enclosure without opening the enclosure door to thereby limit exposure of the personnel to electrical equipment within the enclosure, the convenience interface device comprising:
    a convenience interface housing;
    an assembly disposed within the convenience interface housing, the assembly having an inside face and an outside face opposite the inside face, the inside face for being disposed within the enclosure, the outside face for being outside of the enclosure;
    an inside power receptacle on the inside face and accessible from inside the enclosure;
    an outside power receptacle on the outside face and accessible from outside the enclosure;
    a cover assembly comprising a cover and a cover receiving frame operatively connected to the convenience interface housing for covering the outside face of the assembly when the cover is in a closed position or a securely closed position and allowing access to the outside face of the assembly when the cover is in an open position;
    a first metal insert and a first magnet for magnetically connecting together, one of the first metal insert and the first magnet on one of the cover or the receiving frame and the other of the first metal insert and the first magnet on the other of the cover or the receiving frame; and
    a second metal insert and a second magnet for magnetically connecting together, one of the second metal insert and the second magnet on one of the cover or the receiving frame and the other of the second metal insert and the second magnet on the other of the cover or the receiving frame;
    wherein each of the first metal insert and the second metal insert is threaded to receive a screw;
    wherein the first magnet is positioned around a first aperture for receiving a first screw and wherein the second magnet is positioned around a second aperture for receiving a second screw.

2. The convenience interface device of claim 1 further comprising a hinge operatively connected between the cover receiving frame and the housing.

3. A convenience interface device for personnel to access devices that reside inside an enclosure without opening the enclosure door, the convenience interface device comprising:
    a convenience interface housing;
    an assembly disposed within the convenience interface housing, the assembly having an inside face and an outside face opposite the inside face, the inside face for being disposed within the enclosure, the outside face for being outside of the enclosure;
    an inside power receptacle on the inside face and accessible from inside the enclosure;
    an outside power receptacle on the outside face and accessible from outside the enclosure;
    a cover assembly comprising a cover and a cover receiving frame operatively connected to the convenience interface housing;
    a first aperture within the cover receiving frame with a first metal insert positioned within the first aperture;
    a second aperture within the cover receiving frame with a second metal insert positioned within the second aperture;
    a first aperture within the cover with a first magnet positioned around the first aperture within the cover;
    a second aperture within the cover with a second magnet positioned around the second aperture within the cover;
    wherein each of the first metal insert and the second metal insert is threaded to receive a screw.

4. The convenience interface device of claim 3 further comprising a hinge operatively connected between the cover receiving frame and the housing.

5. A convenience interface device for personnel to access devices that reside inside an enclosure without opening the enclosure door, the convenience interface device comprising:

a convenience interface housing;

an assembly disposed within the convenience interface housing, the assembly having an inside face and an outside face opposite the inside face, the inside face for being disposed within the enclosure, the outside face for being outside of the enclosure;

an inside power receptacle on the inside face and accessible from inside the enclosure;

an outside power receptacle on the outside face and accessible from outside the enclosure;

a cover assembly comprising a cover and a cover receiving frame operatively connected to the housing;

a first aperture within the cover receiving frame with a first magnet positioned around the first aperture;

a second aperture within the cover receiving frame with a second magnet positioned around the second aperture;

a first aperture within the cover with a first metal insert positioned within the first aperture within the cover;

a second aperture within the cover with a second metal insert positioned within the second aperture within the cover;

wherein each of the first metal insert and the second metal insert is threaded to receive a screw.

6. The convenience interface device of claim 5 further comprising a hinge operatively connected between the cover receiving frame and the housing.

7. A convenience interface device for personnel to access devices that reside inside an enclosure without opening the enclosure door to thereby limit exposure of the personnel to electrical equipment within the enclosure, the convenience interface device comprising:

a convenience interface housing;

an assembly disposed within the convenience interface housing, the assembly having an inside face and an outside face opposite the inside face, the inside face for being disposed within the enclosure, the outside face for being outside of the enclosure;

an inside power receptacle on the inside face and accessible from inside the enclosure;

an outside power receptacle on the outside face and accessible from outside the enclosure;

a cover assembly comprising a cover and a cover receiving frame operatively connected to the convenience interface housing for covering the outside face of the assembly when the cover is in a closed position and allowing access to the outside face of the assembly when the cover is in an open position;

a hinge operatively connected between the cover receiving frame and the cover, the cover having a free end opposite the hinge;

a first metal insert positioned on the cover receiving frame;

a first magnet positioned on the cover proximate the free end of the cover such that when the cover assembly is in the closed position, the first magnet is magnetically connected to the first metal insert.

8. The convenience interface device of claim 7 further comprising a first aperture within the cover proximate the free end and wherein the first magnet is positioned annularly around the first aperture.

9. The convenience interface device of claim 8 wherein the first metal insert is threaded to receive a screw.

10. The convenience interface device of claim 7 further comprising:

a second metal insert positioned on the cover receiving frame;

a second magnet positioned on the cover proximate the free end of the cover and spaced apart from the first magnet such that when the cover assembly is in the closed position the second magnet is magnetically connected to the second metal insert.

11. The convenience interface device of claim 10 further comprising a first aperture within the cover and a second aperture within the cover and wherein the first magnet extends annularly around the first aperture and wherein the second magnet extends annularly around the second aperture.

* * * * *

UNITED STATES PATENT AND TRADEMARK OFFICE
CERTIFICATE OF CORRECTION

| | |
|---|---|
| PATENT NO. | : 10,522,937 B2 |
| APPLICATION NO. | : 16/191276 |
| DATED | : December 31, 2019 |
| INVENTOR(S) | : Philip Brown Allen et al. |

It is certified that error appears in the above-identified patent and that said Letters Patent is hereby corrected as shown below:

On the Title Page

Item (72), Inventors, change "Philip Brown Allen, Davenport, IA (US); Drew Philip Allen, Davenport, IA (US)" to --Philip Brown Allen, Davenport, IA (US); Drew Philip Allen, Davenport, IA (US); Bekah Elise Allen, Bettendorf, IA (US)--

Signed and Sealed this
Eleventh Day of July, 2023

Katherine Kelly Vidal
*Director of the United States Patent and Trademark Office*